United States Patent [19]

Fremerey

[11] 4,310,795

[45] Jan. 12, 1982

[54] CIRCUIT MEASURING AVERAGE PERIOD OF PERIODIC SIGNAL

[75] Inventor: Johan K. Fremerey, Bonn, Fed. Rep. of Germany

[73] Assignee: Kernforschungsanlage Jülich, Gesellschaft mit beschränkter Haftung, Jülich, Fed. Rep. of Germany

[21] Appl. No.: 136,926

[22] Filed: Apr. 3, 1980

[30] Foreign Application Priority Data

Apr. 7, 1979 [DE] Fed. Rep. of Germany ....... 2914072

[51] Int. Cl.³ .............................................. G01R 23/02
[52] U.S. Cl. ................................. 324/78 D; 324/83 D
[58] Field of Search ............... 324/78 D, 79 D, 83 D; 235/151.31

[56] References Cited

U.S. PATENT DOCUMENTS

| | | | |
|---|---|---|---|
| 4,027,146 | 5/1977 | Gilmore | 324/78 D |
| 4,034,745 | 7/1977 | Bloom | 324/78 D |
| 4,070,618 | 1/1978 | Thomas | 324/78 D |
| 4,168,467 | 9/1979 | Bailey | 324/83 D |

*Primary Examiner*—Michael J. Tokar
*Attorney, Agent, or Firm*—Karl F. Ross

[57] ABSTRACT

A device for determining the average period of a low-frequency periodic signal comprises a counter receiving stepping pulses from a high-frequency pulse generator and resetting pulses from a phase-angle detector monitoring the periodic signal. A shift register is loaded with the count of the counter in response to each pulse generated by the detector, an adder at an output of the shift register emitting a signal coding the sum of the contents of this register. Another shift register is loaded under the control of the detector with the output sums of the adder and has a first and a last storage cell connected to a substractor which emits a signal indicating changes in average period. Further registers and summing circuitry may be inserted between the adder and the additional shift register for increasing the number of periods taken to form each average-period estimate.

10 Claims, 9 Drawing Figures

CIRCUIT MEASURING AVERAGE PERIOD OF PERIODIC SIGNAL

FIELD OF THE INVENTION

My present invention relates to a circuit for monitoring the frequency of a periodic signal. In particular, my present invention relates to a circuit for measuring the average period of a low-frequency periodic signal.

BACKGROUND OF THE INVENTION

In the field of telemetry it is often necessary to monitor the frequency of a periodic signal and to detect any frequency variations. Such monitoring of a low-frequency signal is conventionally implemented by first measuring the period of the signal and then converting this measurement to a frequency value. Generally, a high-frequency pulse train is fed as a stepping signal to a counter whose operations are started and stopped by pulses derived from zero-crossings of consecutive cycles of the low-frequency periodic signal. The pulses counted by the counter are proportional in number to the duration of the period of the low-frequency signal. An advantage of this measurement is the reduction of error arising from an uncounted pulse. For example, in directly measuring the frequency of a 10-Hz sinusoidal signal by counting the number of pulses derived from similarly sloped zero crossings during a one-second interval, the error due to missing a pulse is ten percent, whereas in measuring the period of the 10-Hz signal by counting the number of pulses arriving from a 1-MHz oscillator during a 0.1-second interval, the error due to miscounting a pulse is only 0.001%.

Such high accuracy, however, is rarely attained in practice, because the zero crossings of the sinusoidal signal do not recur at identical intervals. This phenomenon, observable as a "jitter" of the signal along the time axis of an oscillograph output, is statistical in nature and arises as a result of random interference voltages harmonically unrelated to the sinusoidal signal being monitored. Telemetry systems frequently have an interference-voltage range of forty decibels, which introduces into a periodic signal a jitter having a magnitude equal to 0.1% of the signal's period. Such a jitter increases the error of the above-described period measurement method by a factor of a hundred.

Devices are known in which the effects of jitter on the accuracy of period measurement are reduced by several orders of magnitude. Most of these devices calculate an average period by counting stepping pulses during n consecutive cycles of the monitored signal and dividing the resulting sum by n. For example, a counter whose contents are incrementable by a high-frequency pulse train is enabled by a pulse derived from a cycle of the monitored signal and is later disabled by a pulse derived from the hundredth subsequent cycle of this signal. The counter contents upon disabling are proportional to the hundred-cycle interval. The effects of jitter, however, are the same as for a single cycle. Thus, upon division of the counter contents by 100, jitter-induced error is reduced by the same factor.

A disadvantage of period-averaging devices of this kind is the delay involved. For instance, the averaging of a 10-Hz signal over 100 cycles requires 10 seconds. Even longer delays may be necessary, depending on the magnitudes of the interference voltages and the accuracy requirements. In the particular case of monitoring shaft rotation, conventional devices are only limitedly useful.

Measurement accuracy can be raised through the use of circuitry inserted upstream of the period counter for decreasing zero-crossing shifts due to jitter. Such a solution has the inherent disadvantage of being restricted to narrow frequency bands.

OBJECTS OF THE INVENTION

An object of my present invention is to provide an improved device for measuring the average period of a low-frequency periodic signal.

A more particular object of my present invention is to provide such a device which is not limited to a narrow frequency band and which reduces delays implicit in conventional measuring devices.

SUMMARY OF THE INVENTION

A device for determining the average period of a low-frequency signal comprises, according to my present invention, a phase-angle detector or monitor, a pulse generator, a counter, a data register and a summer. The phase monitor receives the periodic signal and emits an enabling pulse upon detecting a predetermined phase angle of the periodic signal, while the pulse generator produces a train of high-frequency stepping pulses. The counter is connected at a resetting input to the monitor and at a stepping input to the generator for counting the number of stepping pulses emitted thereby between consecutive enabling pulses from the phase monitor. The data register is connected to the monitor and to the counter for loading the contents thereof in response to each enabling pulse from the monitor; the register has a plurality of storage cells for temporarily memorizing respective counts attained by the counter during a plurality of consecutive cycles of the periodic signal. The summer is coupled to the register for algebraically combining the cell contents thereof to obtain, upon the emission of each enabling pulse by the monitor, a respective total stepping-pulse number or sum proportional to the average period of the periodic signal.

A major advantage of a period measuring device according to my present invention is the increased density of estimates or samples of the average period of the signal being monitored. A device according to my present invention can provide a value for the average period for each cycle of the monitored signal. This increase in estimate density is due to the effective overlapping in the data register of consecutive total stepping-pulse sums. Each such sum may be fed to an arithmetic divider for being divided by the number of storage cells in the data register to yield a respective average period. It is particularly advantageous to provide the data register with ten storage cells, whereby each total stepping-pulse number at the output of the summer may be converted from binary to base ten with the decimal point shifted one place to the left to effect the division yielding the period average.

The data register is preferably in the form of a shift register connected at a loading input to the counter and at a shift-enabling input to the monitor, whereby the contents of each storage cell is shifted into the next cell upon the generation of a pulse by the phase monitor, a new stepping-pulse count being loaded into the first cell of the register. The summer may be connected to each cell of the shift register and automatically receive the total contents thereof upon each enabling pulse, whereby a sequential reading of stepping-pulse counts from respective cells of the data register is obviated. However, it is more advantageous to insert a subtractor or differential circuit between the shift register and the summer, the differential circuit being connected to a first and to a last storage cell of the register for forming the difference between the contents of such cells. The summer then modifies, upon each enabling pulse from the monitor, a total stepping pulse number by the difference calculated by the differential circuit. The advantage of this circuit lies in the ease of inserting further storage cells in the shift register; it is not necessary to change any of the connections between the different components of the period measuring device provided that the differential circuit remains connected to the first and the last storage cells of the shift register.

According to another feature of my present invention, an additional shift register having a multiplicity of cascaded storage cells is connected to the summer and to the monitor for loading in response to each enabling pulse therefrom a total stepping-pulse sum at the output of the summer and for thereby temporarily memorizing a multiplicity of sums calculated and emitted by the summer during respective consecutive cycles of the periodic signal being monitored. A subtractor or algebraic-differencing circuit is connected to the additional shift register for forming the difference between nonconsecutive stepping-pulse totals calculated by the summer. Preferably, the additional shift register has $N+1$ storage cells, where N is divisible by ten, and the algebraic-differencing circuit is connected to a first and to a last storage cell of this shift register for forming the difference between the respective contents of such first and last cells. This difference represents change in the average period calculated by the summer and can be used for stabilizing the frequency of the periodic signal. The change in average period is determined at the same rate, i.e. with the same time density, as the average.

According to another feature of my present invention, an additional data register and an adder are connected in cascade or series between the summer and the additional shift register for adding a plurality of consecutive sums or stepping-pulse totals formed by the summer, the algebraic-differencing circuit forming the difference between a pair of nonconsecutive sums calculated by the adder. The additional data register and the adder multiply the number of consecutive cycles taken to calculate an average period; this decreases the range of estimation and the magnitude of the changes coded at the output of the algebraic-differencing circuit.

According to yet another feature of my present invention, the summer comprises an arithmetic unit operating in a time-division mode for performing addition and subtraction operations on the contents of the first and last storage cells of the data register immediately downstream of the counter. Calculated sums and differences are temporarily stored in registers.

Period measuring devices according to my present invention are of particular utility in control, regulation and monitoring processes in which interference sources such as voltages have effects lasting for hours or days. Very small rates of change of monitored frequencies may be detected. For example, in the familiar gas-friction vacuum meter with magnetically suspended steel ball, it is necessary to detect changes in the rotation rate of the ball on the order of 10 rpm/hr. Such fineness of measurement can be achieved with conventional devices only with intervals lasting approximately one minute. A device according to my present invention with 16 or 17 storage cells in each data register may yield results of the same exactness in one-second intervals. This facilitates a quasi-continuous measuring operation, which finds application in automatic gas-flow control and pressure-regulating systems.

A device according to my invention is also utilizable in systems with shorter time constants, since the response time of the device is not limited by the shift time of the data through the summing and differencing units. Because no extended operations such as division and multiplication are required, the device has a particularly low fundamental time lag. It is, therefore, especially suitable for applications in electromechanical control systems, insofar as frequency modulated values are available, as is the case in rotation rate control and the positioning of bodies by means of electric or magnetic fields.

BRIEF DESCRIPTION OF THE DRAWING

These and other features of my present invention will now be described in detail, reference being made to the accompanying drawing in which.

SPECIFIC DESCRIPTION

Figure 1:
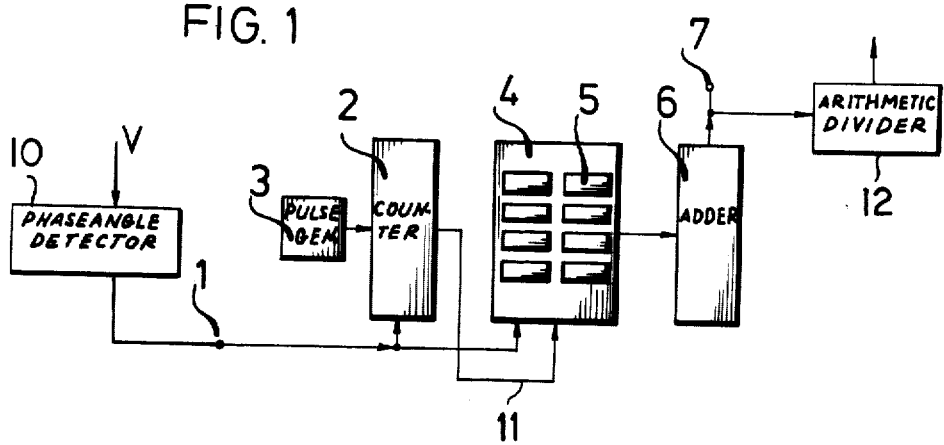
FIG. 1 is a block diagram of a device for determining the average period of a periodic signal, according to my present invention, showing a data register feeding an adder.

As shown in FIG. 1, a device for measuring the average period of a low-frequency periodic signal V comprises, according to my present invention, a binary counter 2 connected at a stepping input to a high-frequency pulse generator 3 and at a resetting input to a phase-angle detector 10 for counting the number of stepping pulses emitted by the generator during the intervals between consecutive enabling pulses from phase-angle detector 10. This detector monitors the periodic signal V and has an output lead 1 extending to the resetting input of counter 2 for emitting a resetting or enabling signal thereto upon detecting a predetermined phase of a periodic signal V. More particularly, detector 10 may include a differentiator and a voltage comparator (not shown) for detecting a positive-to-negative zero-crosssing of a sinusoidal periodic input signal V.

Counter 2 may be conventionally implemented as a chain of flip-flops (not shown) connected at respective resetting inputs to lead 1 and at respective clock inputs to generator 3, as described in *Logical Design for Computers and Control* by K. N. Dodd (pages 24–28). Counter 2 has an output multiple 11 working into a data register 4 having an enabling input tied to lead 1 and n storage cells 5 for memorizing respective counts attained by counter 2 during n consecutive cycles of periodic signal V. Register 4 may comprise a read/write memory with an internal command generator and sequencer (not shown) operating in response to the pulses produced by phase-angle detector or signal monitor 10.

At an output of register 4 is a binary adder 6 having a structure and function described in *Pulse, Digital and Switching Waveforms* by J. Millman and H. Taub (pages 338–342). Upon the emission of each pulse by monitor 10, adder 6 generates on an output multiple 7 a signal coding the sum of n consecutive stepping-pulse sums stored in data register 4. Multiple 7 extends to an arithmetic divider 12 which divides by n the total stepping-pulse number at the output of adder 6 to determine the average period of signal V. The resulting average may be fed to an arithmetic inverter (not shown) for determining the average frequency of signal V.

Figure 2:
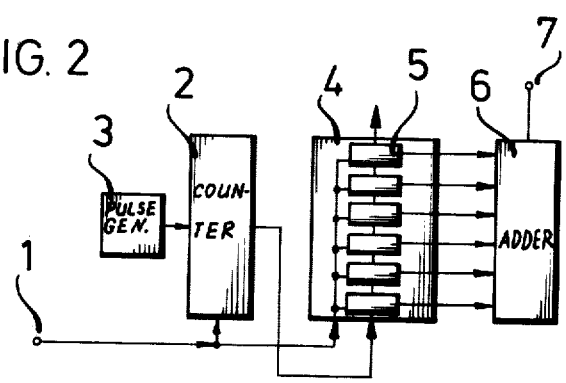
FIGS. 2–5 are block diagrams similar to FIG. 1.

As shown in FIG. 2, register 4 is advantageously in the form of a shift register (see pages 346–7 of *Pulse, Digital and Switching Waveforms*) whose cascaded storage cells 5 are tied at a loading input to multiple 11, at respective shift-enabling inputs to lead 1 and at respective outputs to adder 6. The appearance of a pulse on lead 1 enables the transfer of a current stepping-pulse count from counter 2 to a first storage cell of register 4 and the resetting of the counter for a subsequent cycle of periodic signal V. Adder 6 emits on multiple 7 a signal coding the sum of the contents of all the cells of register 4.

Figure 3:
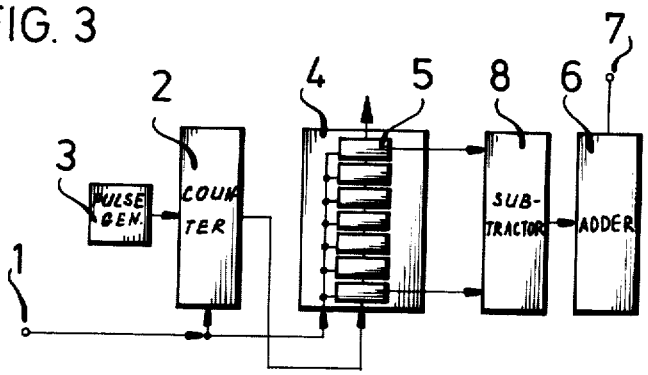

Because an enabling pulse from monitor 10 induces the shifting of the contents of the $i^{th}$ cell (i=1, 2, 3 ... n) to the $(i+1)^{th}$ cell and introduces a new count into the first cell of register 4, consecutive sums calculated by adder 6 will diverge only by the difference between the stepping-pulse count loaded into the first cell of register 4 upon this enabling pulse and the count shifted into the last or $n^{th}$ cell upon the immediately preceding enabling pulse. Thus, as shown in FIG. 3, adder 6 may be replaced by a subtractor or differential circuit 8 and another adder 6', subtractor 8 being connected at a pair of inputs to the first cell and the last cell of register 4 for forming the difference between the contents of these cells. Adder 6' has one input extending from subtractor 8 and, although substantially similar to adder 6, includes a memory (not shown) connected to the adder output multiple 7 for temporarily storing addition results. Adder 6' algebraically combines a difference emitted by subtractor 8 upon the generation of an enabling pulse by monitor 10 and a sum calculated by adder 6' upon a preceding enabling pulse.

Figure 4:
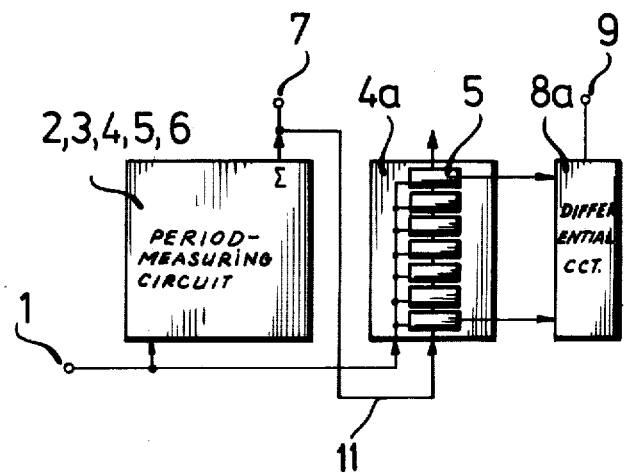

As illustrated in FIG. 4, a period-measuring device according to our present invention may further comprise an additional shift register 4a coupled at a data-loading input to adder output multiple 11 and at a shift enabling input to monitor output lead 1. Register 4a has at least three storage cells, the first and last of which feed an additional subtractor or differential circuit 8a. Shift register 4a and subtractor 8a cofunction to produce on an output multiple 9 a signal coding the difference between a pair of nonconsecutive stepping pulse totals summed by adder 6 or 6'. Changes in the average period of signal V may be monitored via consecutive signals emitted on multiple 9.

Figure 5:
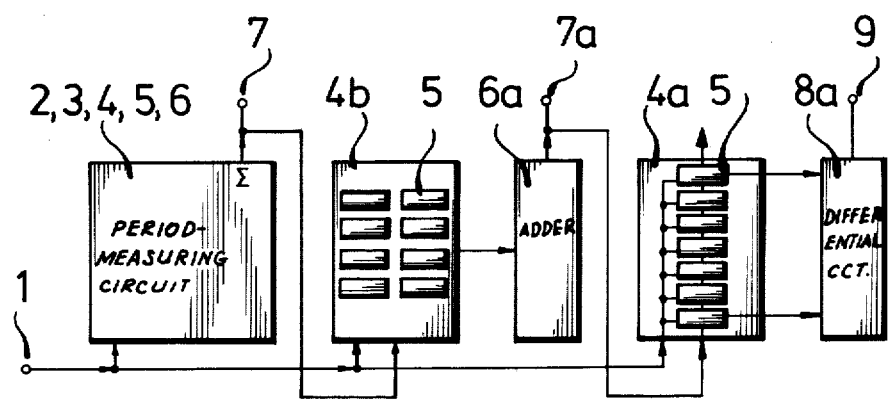

As shown in FIG. 5, another register 4b and another adder 6a may be inserted between adder 6 or 6' and shift register 4a for increasing the number of periods of signal V over which an average is obtained. Register 4b has data-loading and enabling inputs tied to multiple 7 and lead 1, respectively, and is connected at an output to adder 6a which in turn has an output multiple 7a working into register 4a at the data-loading input thereof. Let us assume that register 4b has m storage cells. Then upon each enabling or phase-indicating pulse generated by monitor 10, adder 6a feeds to shift register 4a a signal indicating the number of stepping pulses received by counter 2 during the preceding n·m cycles of signal V.

Figures 6A, 6B, 6C:
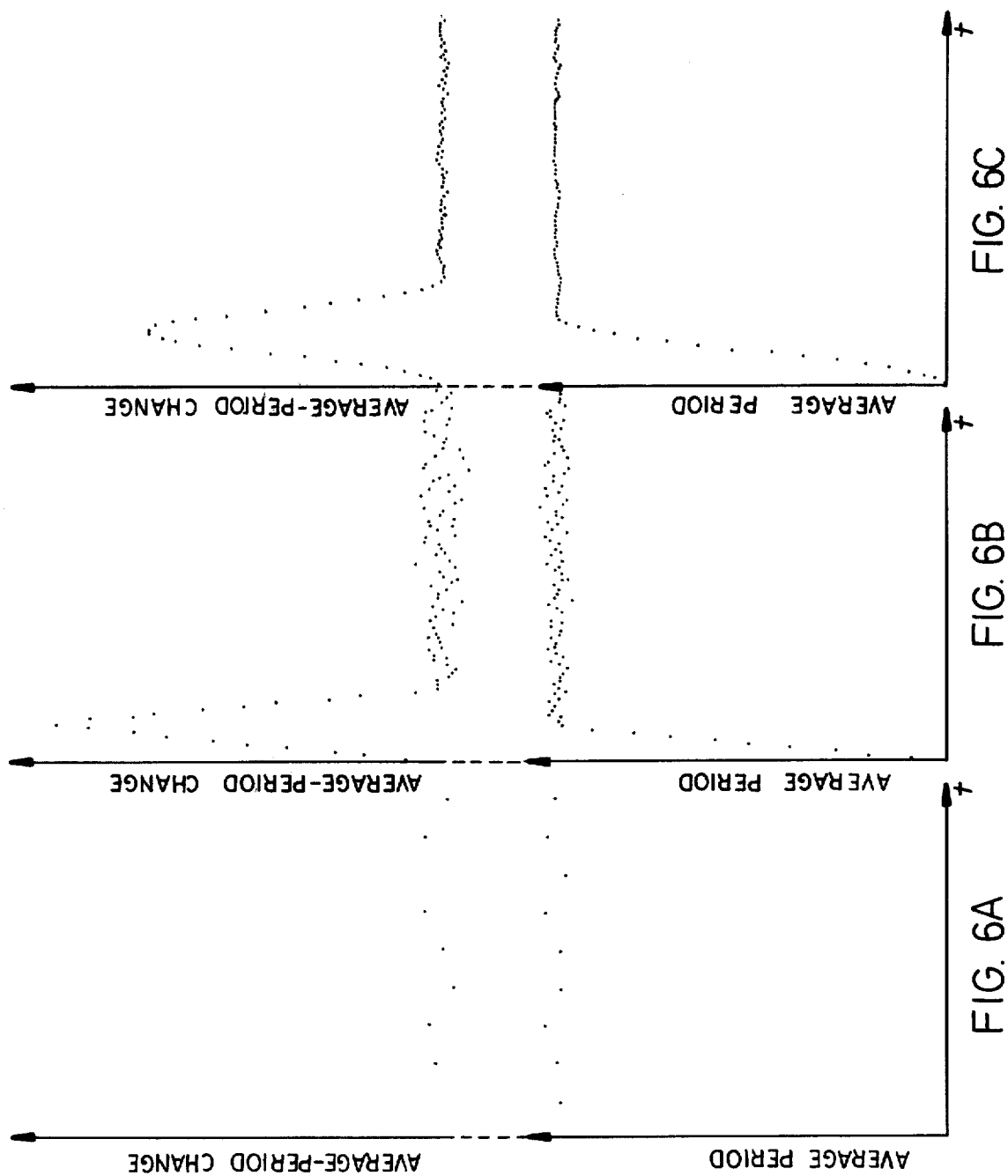
FIG. 6A is a pair of graphs of average period and changes in average period in an alternating signal, as measured by a conventional device.
FIGS. 6B–6C are graphs similar to those of FIG. 6A, showing average periods and changes in average periods of a similar alternating signal, as measured by the devices of FIGS. 4 and 5, respectively.

The bottom graphs of FIGS. 6A–6C show period averages obtained from the output of a conventional measuring device, from output 7 and from output 7a of a device according to my present invention, respectively. The top graphs of FIGS. 6A–6C show corresponding average-period changes, the points in the upper graphs of FIGS. 6B and 6C being derived from the signals emitted on output 9 of the device illustrated in FIGS. 4 and 5, respectively. A comparison of FIGS. 6A and 6B clearly indicates one advantage of a device according to my present invention; the device illustrated in FIG. 4 yields a much denser array of data than a conventional period-measuring device. Thus, fluctuations in an average period are more readily observable. As indicated by FIG. 6C, the device of FIG. 5 produces an average period and an average-period change of strongly reduced distribution.

Figure 7:
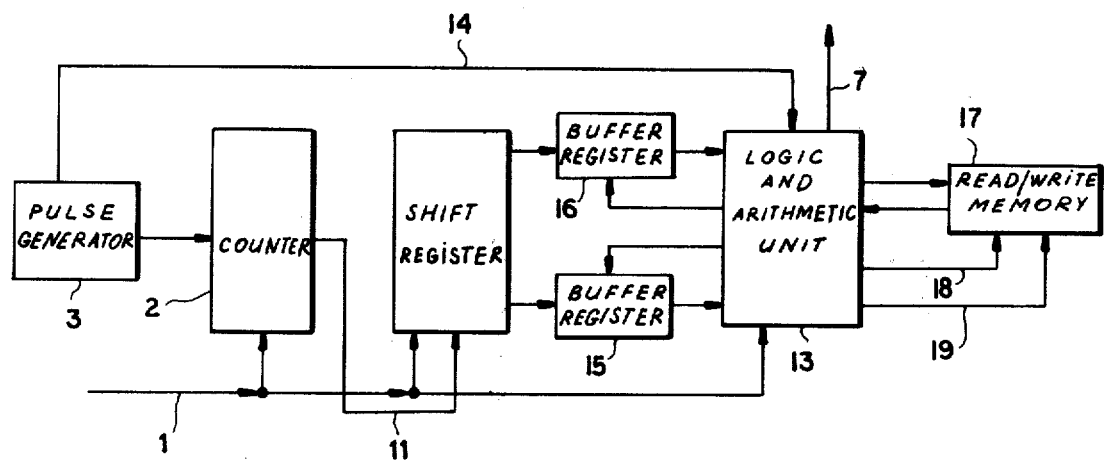
FIG. 7 is a block diagram similar to FIGS. 1–3, showing an arithmetic unit and memory operating in time-division mode performing addition and subtraction operations.

As illustrated in FIG. 7, the operations executed by subtractor 8 and adder 6' (FIG. 3) may be performed in a time-division mode by a logic and arithmetic unit 13 in response to timing pulses received from the frequency-stabilized pulse generator 3 via a lead 14. Upon the appearance of an enabling pulse on lead 1, unit 13 loads counts temporarily stored in buffer registers 15 and 16 which are connected to the first and last storage cells of shift register 4. These counts are subtracted from one another and the result is temporarily stored in a read-/write memory 17 which receives addresses and reading and writing commands via leads 18, 19. A previously calculated sum is read from memory 17 and incremented or decremented by the result of the differencing operation; the modified sum is emitted over multiple 7.

I claim:

1. A device for determining the average period of a low-frequency period signal, comprising:
   a phase-angle monitor receiving said periodic signal for emitting an enabling pulse upon detecting a predetermined phase angle of said periodic signal;
   a pulse generator for producing a train of high-frequency stepping pulses;
   a counter connected at a resetting input to said monitor and at an incrementing input to said generator for counting the number of said stepping pulses between consecutive enabling pulses;
   a data register connected to said monitor and to said counter for loading the contents thereof in response to each enabling pulse from said monitor, said register having a plurality of storage cells for memorizing respective counts attained by said counter during a plurality of consecutive cycles of said periodic signal; and
   summing means connected to said register for algebraically combining the cell contents thereof to obtain, upon the emission of each enabling pulse, a respective total stepping-pulse number proportional to the average period of said periodic signal.

2. The device defined in claim 1, further comprising adding means operatively connected to said summing means and to said monitor for adding, in response to each enabling pulse therefrom, a plurality of consecutive sums formed by said summing means, further comprising a shift register having a multiplicity of cascaded storage cells operatively coupled to said adding means and to said monitor for loading in response to each enabling pulse therefrom a sum at an output of said adding means to temporarily memorize a multiplicity of sums calculated by said adding means during respective consecutive cycles of said periodic signal, further comprising an algebraic-differencing circuit connected to said shift register for forming the difference between a pair of nonconsecutive sums formed by said adding means.

3. The device defined in claim 2 wherein said adding means comprises a register and an adder connected in cascade between said summing means and said shift register.

4. The device defined in claim 1, further comprising a shift register having a multiplicity of cascaded storage cells operatively connected to said summing means and to said monitor for loading in response to each enabling pulse therefrom a stepping-pulse sum at an output of said summing means to temporarily memorize a multiplicity of sums calculated and emitted by said summing means during respective consecutive cycles of said periodic signal, further comprising an algebraic-differencing circuit connected to said shift register for forming the difference between a pair of nonconsecutive sums calculated by said summing means.

5. The device defined in claim 1 wherein the number of storage cells of said register is divisible by ten.

6. The device defined in claim 2, 3 or 4 wherein said shift register has $N+1$ storage cells, where N is an integer divisible by ten, and wherein said algebraic-differencing circuit is connected to a first storage cell and to a last storage cell of said shift register for forming the difference between the respective contents of such first and last storage cells.

7. The device defined in claim 1, 2, 3, 4 or 5 wherein said summing means includes an arithmetic unit operating in a time-division mode for performing addition and subtraction operations on the contents of a first storage cell and a last storage cell of said data register.

8. The device defined in claim 1, 2, 3, 4 or 5 wherein said data register is a shift register.

9. The device defined in claim 8 wherein said summing means includes a differential unit connected to a first storage cell and to a last storage cell of said data register for calculating the difference between respective stepping-pulse counts registered in such first and last storage cells, an adder being connected to said differential unit for adding, upon the emission of an enabling pulse by said monitor, the output of said differencing circuit and a sum calculated by such adder upon the generation of a preceding enabling pulse by said monitor.

10. The device defined in claim 8 wherein said summing means comprises an adder connected to each storage cell of said data register for forming a sum of the contents thereof upon the emission of each enabling pulse by said monitor.

* * * * *